United States Patent
Park

(10) Patent No.: US 9,054,336 B2
(45) Date of Patent: Jun. 9, 2015

(54) ORGANIC LIGHT-EMITTING DISPLAY DEVICE

(75) Inventor: Jin-Woo Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 138 days.

(21) Appl. No.: 13/605,974

(22) Filed: Sep. 6, 2012

(65) Prior Publication Data
US 2013/0229107 A1 Sep. 5, 2013

(30) Foreign Application Priority Data

Mar. 2, 2012 (KR) .................. 10-2012-0022042

(51) Int. Cl.
*H01J 9/00* (2006.01)
*H01J 9/50* (2006.01)
*H01L 51/52* (2006.01)

(52) U.S. Cl.
CPC ....... *H01L 51/5253* (2013.01); *H01L 2251/556* (2013.01)

(58) Field of Classification Search
CPC .................................. H01L 51/5253
USPC ........................ 445/2, 58; 313/504
See application file for complete search history.

(56) References Cited

U.S. PATENT DOCUMENTS

| 7,648,925 | B2 | 1/2010 | Moro et al. | |
|---|---|---|---|---|
| 7,829,147 | B2 | 11/2010 | Aitken et al. | |
| 2004/0247938 | A1* | 12/2004 | Yamaguchi et al. | 428/690 |
| 2005/0239294 | A1 | 10/2005 | Rosenblum et al. | |
| 2007/0181872 | A1* | 8/2007 | Lee et al. | 257/40 |
| 2008/0129194 | A1 | 6/2008 | Abe et al. | |
| 2008/0233826 | A1* | 9/2008 | Matsuda | 445/2 |
| 2010/0187986 | A1* | 7/2010 | Kajitani et al. | 313/504 |
| 2011/0063808 | A1* | 3/2011 | Chen et al. | 361/750 |

FOREIGN PATENT DOCUMENTS

| KR | 10-0942038 | 2/2010 |
|---|---|---|
| WO | WO 03/088370 A3 | 10/2003 |

OTHER PUBLICATIONS

"Formation of silica coating films from spin-on polysilazane at room temperature and their stability in hot water" by Kubo et al., published in J. Mater. Res., vol. 19, No. 2, Feb. 2004.*
EPO Search Report dated Dec. 19, 2014, for corresponding European Patent application 12194302.1, (10 pages).

* cited by examiner

*Primary Examiner* — Karabi Guharay
*Assistant Examiner* — Zachary J Snyder
(74) *Attorney, Agent, or Firm* — Christie, Parker & Hale, LLP

(57) ABSTRACT

An organic light-emitting display device including: a substrate; an organic emission unit that is formed on the substrate and includes a laminate of a first electrode, an organic emission layer, and a second electrode; at least one organic layer that is formed on the substrate; and at least one inorganic layer that is formed on the substrate, contacts the organic layer in a planar direction, and contacts an environmental element to surround at least one border of the environmental element.

23 Claims, 5 Drawing Sheets

ORGANIC LIGHT-EMITTING DISPLAY DEVICE

CROSS-REFERENCE TO RELATED PATENT APPLICATION

This application claims priority to and the benefit of Korean Patent Application No. 10-2012-0022042, filed on Mar. 2, 2012, in the Korean Intellectual Property Office, the disclosure of which is incorporated herein in its entirety by reference.

BACKGROUND

1. Field

The following description relates to an organic light-emitting display device, and more particularly, to an organic light-emitting display device having an improved sealing structure.

2. Description of the Related Art

Applications of organic light-emitting display devices range from personal portable devices such as MP3 players and mobile phones to television sets due to these display devices having superior characteristics such as wide viewing angles, high contrast ratios, short response times, and low amounts of power consumption.

Characteristics of organic light-emitting display devices deteriorate by the infiltration of oxygen or moisture. Accordingly, organic light-emitting display devices need to have a sealing structure for preventing the infiltration of oxygen and moisture.

Particularly, deterioration of sealing characteristics caused by various particles inevitably contained therein during a manufacturing process needs to be prevented. Furthermore, since organic light-emitting display devices are widely used as flexible display devices, there is a need to develop a sealing structure having excellent sealing characteristics even while being bent.

SUMMARY

An aspect of an embodiment of the present invention is directed toward an organic light emitting display device having an improved sealing structure.

According to an embodiment of the present invention, there is provided an organic light-emitting display device including: a substrate; an organic emission unit that is formed on the substrate and includes a stacked structure of a first electrode, an organic emission layer, and a second electrode; at least one organic layer formed on the substrate and the organic emission unit; and at least one inorganic layer that is formed on the substrate and the organic emission unit, contacts the organic layer in a planar direction, and contacts an environmental element to surround at least one border of the environmental element.

The organic layer may also contact the environmental element so as to surround the border of the environmental element.

A viscosity transition temperature of an inorganic material contained in the inorganic layer from a solid phase to a liquid phase may be lower than a denaturation temperature of a material contained in the organic emission layer.

The inorganic layer may contact the environmental element so as not to form a gap between the inorganic layer and the environmental element.

The inorganic layer may be formed to have a flat upper surface.

The inorganic layer may include a tin oxide.

The organic layer may be formed to have a flat upper surface.

The organic layer may be formed on the organic emission unit.

The inorganic layer may be formed on the organic emission unit.

The organic light-emitting display device may further include a protective layer interposed between the organic layer or inorganic layer and the organic emission unit.

According to another embodiment of the present invention, there is provided an organic light-emitting display device including: a substrate; an organic emission unit that is formed on the substrate and includes a laminate of a first electrode, an organic emission layer, and a second electrode; a first organic layer that is formed on the substrate and the organic emission unit; and a first inorganic layer that is formed on the substrate and the organic emission unit, to seal the organic emission unit from external air, and is formed by providing fluidity to an inorganic material.

The first inorganic layer may have a flat surface and a non-flat surface which are disposed opposite to each other.

The first organic layer may have a flat surface and a non-flat surface which are disposed opposite to each other.

A temperature at which fluidity is provided to the inorganic material of the first inorganic layer may be less than a denaturation temperature of a material contained in the organic emission layer.

The first inorganic layer may include a tin oxide.

The organic light-emitting display device may further include a second inorganic layer that is disposed on one surface of the substrate to contact the substrate and is formed by providing fluidity to an inorganic material of the second inorganic layer.

A temperature at which fluidity is provided to the inorganic material of the second inorganic layer may be less than a denaturation temperature of a material contained in the organic emission layer.

The second inorganic layer may include a tin oxide.

The organic light-emitting display device may further include a protective layer interposed between the first organic layer or first inorganic layer and the organic emission unit.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Hereinafter, the present invention will be described more fully with reference to the accompanying drawings, in which exemplary embodiments of the invention are shown. As used herein, the term "and/or" includes any and all combinations of one or more of the associated listed items. Expressions such as "at least one of", when preceding a list of elements, modify the entire list of elements and do not modify the individual elements of the list.

Figure 1:
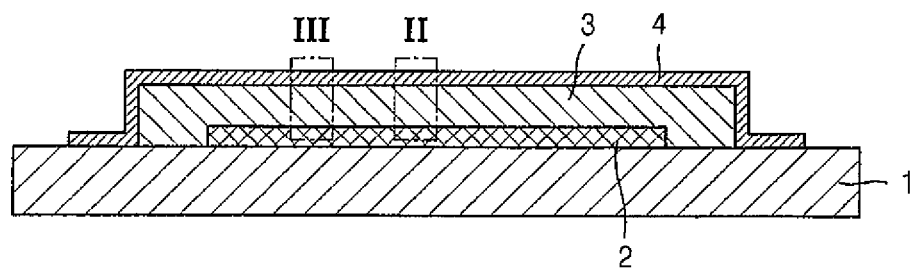
FIG. 1 is a schematic cross-sectional view of an organic light-emitting display device according to an embodiment of the present invention.
Figure 2:
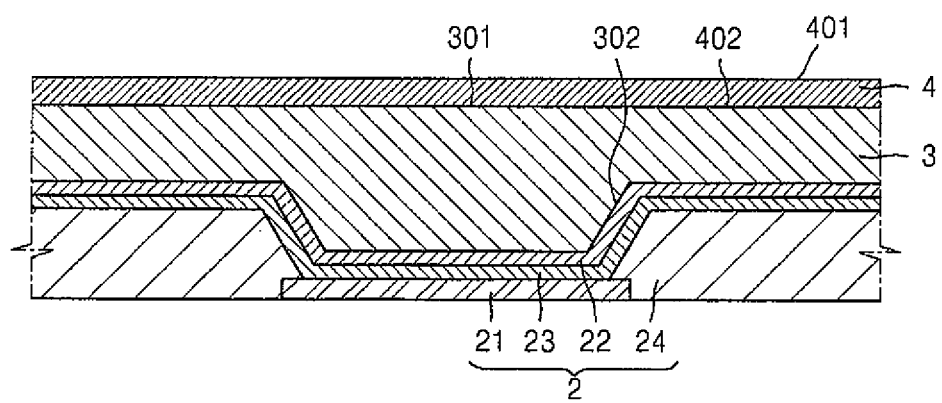
FIG. 2 is a cross-sectional view of a portion II of FIG. 1.

FIG. 1 is a schematic cross-sectional view of an organic light-emitting display device according to an embodiment of the present invention. FIG. 2 is a cross-sectional view of a portion II of FIG. 1, and FIG. 3 is a cross-sectional view of a portion III of FIG. 1.

Figure 3:
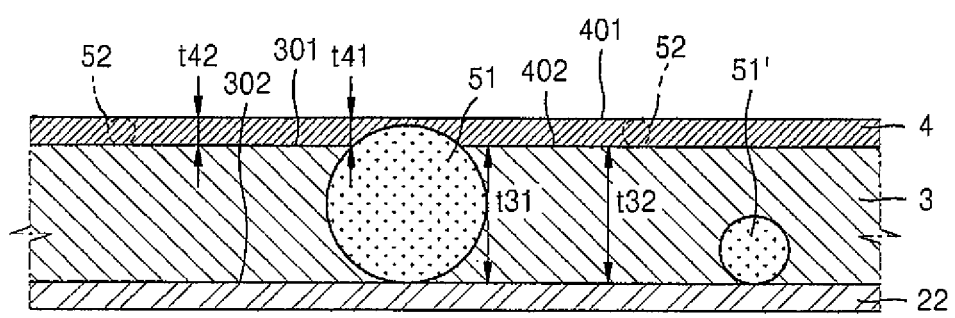
FIG. 3 is a cross-sectional view of a portion III of FIG. 1.

Referring to FIGS. 1 to 3, an organic emission unit 2 is formed on one surface of a substrate 1, a laminate of an organic layer 3 and an inorganic layer 4 is formed on the organic emission unit 2 such that the laminate covers the organic emission unit 2.

The substrate 1 may be formed of glass, but is not limited thereto. The substrate 1 may also be formed of metal or plastic. The substrate 1 may be a flexible substrate that may be bent. In this regard, a bending radius of the substrate 1 may be 10 cm or less.

The organic emission unit 2 formed on the substrate 1 includes a first electrode 21, a second electrode 22, and a laminate of an organic emission layer (e.g., a laminate of various organic layers) 23 interposed between the first electrode 21 and the second electrode 22 as shown in FIG. 2.

Although not shown herein, the organic emission unit 2 includes one pixel circuit per each pixel, and the pixel circuit may include at least one thin film transistor (TFT) and a capacitor.

The first electrode 21 is electrically connected to the TFT.

The first electrode 21 and the second electrode 22 face each other and are insulated from each other by the organic emission layer 23. Borders of the first electrode 21 may be covered with a pixel defining layer 24, and the organic emission layer 23 and the second electrode 22 are formed on the pixel defining layer 24 and the first electrode 21. The second electrode 22 may be a common electrode for covering all pixels, and the first electrode 21 may be formed in each pixel independent from the other pixels.

The first electrode 21 and the second electrode 22 may constitute an anode and a cathode, respectively, and they may have opposite polarities.

If the first electrode 21 constitutes an anode, the first electrode 21 may be formed of a material having a high work function absolute value. If the second electrode 22 constitutes a cathode, the second electrode 22 may be formed of a material having a work function absolute value that is lower than that of the first electrode 21. If the polarities of the first electrode 21 and the second electrode 22 are opposite, the materials may also be exchanged. Hereinafter, an organic light-emitting display device using the first electrode 21 as an anode and the second electrode 22 as a cathode will be described.

The first electrode 21 may include at least one transparent metal oxide selected from the group consisting of ITO, IZO, ZnO, and $In_2O_3$. The second electrode 22 may include at least one metal selected from the group consisting of Al, Ag, Mg, and Cr.

In a bottom emission type organic light-emitting display device in which an image is formed toward the substrate 1, the second electrode 22 may have a relatively large thickness, so that emission efficiency toward the substrate 1 may be increased.

In a top emission type organic light-emitting display device in which an image is formed toward the organic layer 3, the second electrode 22 may have a relatively small thickness, so that the second electrode 22 may be a reflective layer, or the second electrode 22 may be formed of a transparent conductive material. In this case, the first electrode 21 may further include a reflective layer.

In one embodiment, the organic emission layer 23 has a laminate structure of a plurality of organic layers including an emission layer EML. A hole transport layer (HTL) and a hole injection layer (HIL) may be interposed between the EMIL and the first electrode 21, and an electron transport layer (ETL) and an electron injection layer (EIL) may be interposed between the EML and the second electrode 22.

For example, the organic emission layer 23 may include at least one of Compounds 301, 311, and 321 below.

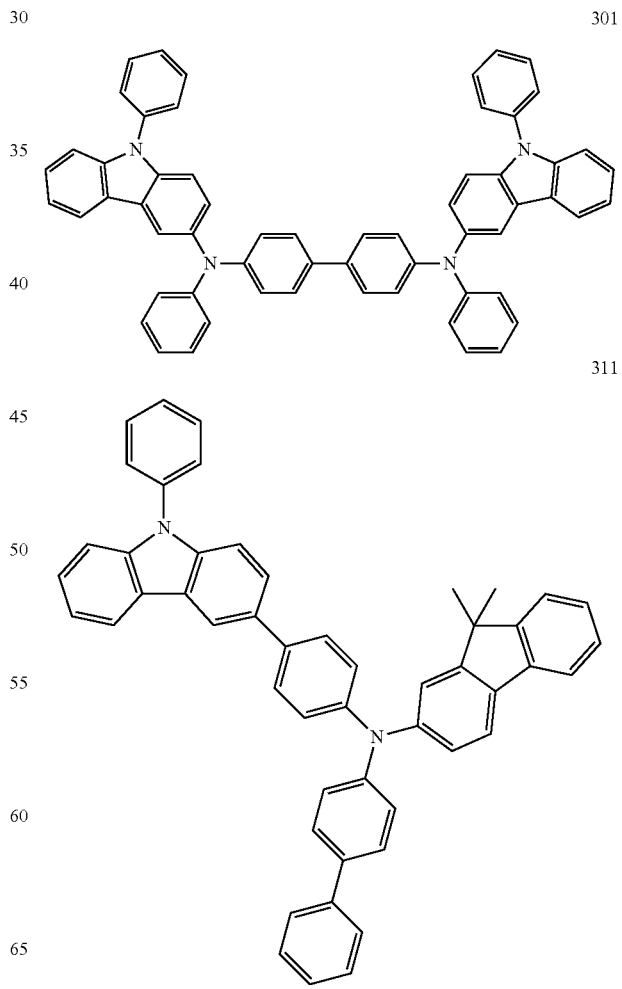

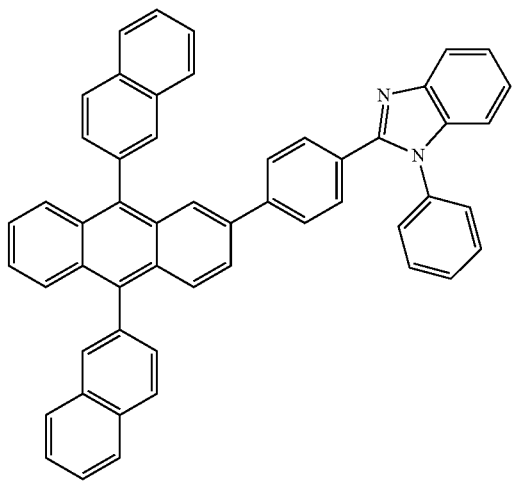

According to an embodiment described with reference to FIGS. 1 to 3, the organic emission unit 2 is covered with a laminate of the organic layer 3 and the inorganic layer 4 that are sequentially formed, the organic emission unit 2 is sealed by the laminate of the organic layer 3 and the inorganic layer 4 so as to prevent external air from infiltrating.

In this regard, the organic layer 3 and the inorganic layer 4 contact an environmental element 51 or 51' to surround at least one border of the environmental element 51 or 51'.

The environmental element 51 or 51' may be particles inevitably attached during the formation of the organic light-emitting display device and may include an organic material and/or an inorganic material. In FIG. 2, the environmental element 51 or 51' may be disposed on the second electrode 22. Although not shown herein, other environmental elements may be disposed within or under the second electrode 22. The upper surface of the organic emission unit 2 may have a bent portion.

The environmental element 51 or 51' cannot be removed by a wet process such as washing after the organic emission unit 2 is formed.

The environmental element 51 or 51' has a size in the range of 1 to 5 μm. The environmental element 51', which is smaller than the environmental element 51, may be covered with the organic layer 3, and the environmental element 51 may be exposed through the organic layer 3.

The inorganic layer 4 may have a thickness greater than that of the organic layer 3, thereby covering the environmental element 51 that is not covered with the organic layer 3 and that is exposed through the organic layer 3.

The organic layer 3 may be formed of a polymer material. The polymer material may include an acrylic material. The organic layer 3 may be formed by forming a thermosetting precursor layer and curing the thermoplastic precursor to form a polymer. Accordingly, the upper surface 301 of the organic layer 3 may be flat as shown in FIG. 2. Here, the lower surface 302 of the organic layer 3 may not be flat due to the bent portion of the pixel defining layer 24. As such, the flat upper surface 301 and the non-flat lower surface 302 of the organic layer 3 are disposed opposite to each other (i.e., facing oppositely away from each other).

Since the upper surface 301 of the organic layer 3 is flat, a thickness t31 of the organic layer 3 at a border of the environmental element 51 is the same as a thickness t32 of the organic layer 3 at a portion spaced apart from the environmental element 51, as shown in FIG. 3. This indicates that the organic layer 3 may have a uniform thickness except for the bent portion of the lower surface 302 as shown in FIG. 2. Thus, the entire surface of the organic emission unit 2 may be uniformly protected.

The inorganic layer 4 is formed on the organic layer 3, and accordingly the inorganic layer 4 contacts the organic layer 3 in a planar direction.

The inorganic layer 4 may include a low temperature viscosity transition (LVT) inorganic material.

The inorganic layer 4 may be formed after being melted and solidified, which will be described later, and a viscosity transition temperature of the inorganic layer 4 is lower than a denaturation temperature of the organic emission layer 23.

As used herein, the "viscosity transition temperature" is not a temperature where the phase of the LVT inorganic material is completely changed from solid to liquid, but is a minimum temperature where the LVT inorganic material has fluidity, i.e., a minimum temperature where the viscosity of the LVT inorganic material changes.

The viscosity transition temperature of the LVT inorganic material may be less than the denaturation temperature of a material contained in the organic emission unit 13. For example, the viscosity transition temperature of the LVT inorganic material may be less than the minimum value of the denaturation temperature of a material contained in the organic emission unit 13.

The denaturation temperature of the organic emission layer 23 refers to a temperature capable of causing physical and/or chemical denaturation in a material contained in the organic emission layer 23, and the organic emission layer 23 may have a plurality of denaturation temperatures according to the type and number of materials contained therein.

For example, the viscosity transition temperature of the LVT inorganic material and the denaturation temperature of the organic emission layer 23 may indicate a glass transition temperature Tg of the LVT inorganic material and the organic material contained in the organic emission layer 23. The Tg may be measured by performing thermo gravimetric analysis (TGA) on the LVT inorganic material and the organic material contained in the organic emission layer 23.

For example, the Tg may be obtained from thermal analysis of the material contained in the organic emission layer 23 by using TGA and differential scanning calorimetry (DSC) in an N₂ atmosphere at a temperature ranging from room temperature to 600° C. (10° C./min) for TGA, at a temperature ranging from room temperature to 400° C. for DSC (Pan Type: Pt Pan in disposable Al Pan (TGA), disposable Al pan (DSC)), and these conditions will be understood by those of ordinary skill in the art.

The denaturation temperature of the material contained in the organic emission layer 23 may be, but is not limited to, higher than 130° C., and may efficiently be measured via TGA analysis of the material contained in the organic emission layer 23 as described above.

The minimum value of the denaturation temperature of the material contained in the organic emission layer 23 may be in the range of 130° C. to 140° C. The minimum value of the denaturation temperature of the material contained in the organic emission layer 23 may be, but is not limited to, 132° C., and may efficiently be measured by measuring Tg of the material contained in the organic emission layer 23 via TGA analysis of the material as described above, and choosing the minimum Tg. For example, the viscosity transition temperature of the LVT inorganic material may be 80° C. or greater, for example, in the range of 80° C. to 132° C., but is not limited thereto.

For example, the viscosity transition temperature of the LVT inorganic material may be in the range of 80° C. to 120° C. or 100° C. to 120° C., but is not limited thereto. For example, the viscosity transition temperature of the LVT inorganic material may be 110° C.

The LVT inorganic material may be a single compound or a mixture of at least two compounds.

The LVT inorganic material may include a tin oxide such as SnO or $SnO_2$.

If the LVT inorganic material includes SnO, the content of the SnO may be in the range of 20% by weight to 100% by weight.

For example, the LVT inorganic material may further include at least one selected from the group consisting of phosphorus oxide (e.g., $P_2O_5$), boron phosphate ($BPO_4$), tin fluoride (e.g., $SnF_2$), niobium oxide (e.g., NbO), and tungsten oxide (e.g., $WO_3$), but is not limited thereto.

For example, the LVT inorganic material may include
SnO;
SnO and $P_2O_5$:
SnO and $BPO_4$;
SnO, $SnF_2$, and $P_2O_5$;
SnO, $SnF_2$, $P_2O_5$, and NbO; or
SnO, $SnF_2$, $P_2O_5$, and $WO_3$.

However, the present invention is not limited to the above.

For example, the LVT inorganic material may include the following ingredients, but is not limited thereto.
SnO (100 wt %);
SnO (80 wt %) and $P_2O_5$ (20 wt %);
SnO (90 wt %) and $BPO_4$ (10 wt %);
SnO (20-50 wt %), $SnF_2$ (30-60 wt %) and $P_2O_5$ (10-30 wt %), where the weight percent of the sum of SnO, $SnF_2$, and $P_2O_5$ is 100 wt %);
SnO (20-50 wt %), $SnF_2$ (30-60 wt %), $P_2O_5$ (10-30 wt %) and NbO (1-5 wt %), where the weight percent of the sum of SnO, $SnF_2$, $P_2O_5$, and NbO is 100 wt %); or
SnO (20-50 wt %), $SnF_2$ (30-60 wt %), $P_2O_5$ (10-30 wt %) and $WO_3$ (1-5 wt %), where the weight percent of the sum of SnO, $SnF_2$, $P_2O_5$, and $WO_3$ is 100 wt %).

For example the LVT inorganic material may include SnO (42.5 wt %), $SnF_2$ (40 wt %), $P_2O_5$ (15 wt %), and $WO_3$ (2.5 wt %), but is not limited thereto.

If the inorganic layer 4 has the above-described composition, the viscosity transition temperature may be maintained lower than the denaturation temperature of the organic emission layer 23, so that various defects that may be formed in the inorganic layer 4 may be rectified by a healing (annealing) process, which will be described later.

As shown in FIG. 3, the inorganic layer 4 may include a film-forming element 52. The film-forming element 52 may be particles of an inorganic material deposited on the organic layer 3 during the formation of the inorganic layer 4 and may be rectified by the healing process that will be described later to constitute one portion of the inorganic layer 4.

As shown in FIG. 3, the environmental element 51 is surmounted by the inorganic layer 4, and thus the lower surface 402 of the inorganic layer 4 may not be flat. In this regard, the upper surface 401 of the inorganic layer 4 is flat, because the inorganic layer 4 is formed by providing fluidity to the inorganic layer 4 during the healing process and solidifying the inorganic layer 4. Accordingly, the flat portion of the upper surface 401 of the inorganic layer 4 and the non-flat portion of the lower surface 402 of the inorganic layer 4 are disposed opposite to each other (i.e., facing oppositely away from each other).

Since the upper surface 401 of the inorganic layer 4 is flat, a thickness t41 of the inorganic layer 4 at a border of the environmental element 51 is the same as a thickness t42 of the inorganic layer 4 at a portion spaced apart from the environmental element 51, as shown in FIG. 3. This indicates that the inorganic layer 4 may have a uniform thickness except for the bent portion of the lower surface 402 as shown in FIG. 3. Thus, the entire surface of the organic emission unit 2 may be uniformly protected.

As shown in FIG. 1, the inorganic layer 4 may have a larger area than the organic layer 3, so that all borders (portion portions) of the inorganic layer 4 facing the substrate can contact the substrate 1. Thus, the organic layer 3 can be completely covered with the inorganic layer 4. Here, since the inorganic layer 4 contacts the substrate 1, an adhesive strength of the inorganic layer 4 with respect to the substrate 1 is improved, and infiltration of external air into the organic emission unit 2 may be more efficiently blocked. Although not shown herein, the organic emission unit 2 further includes a pixel circuit including a TFT as described above, the inorganic layer 4 may contact any insulating layer of the pixel circuit, for example, the TFT. For example, a portion extending from a gate insulating layer among the layers of the TFT may contact the inorganic layer 4. In this regard, since the insulating layers of the TFT is an inorganic insulating layer such as silicon oxide, silicon nitride, and silicon oxynitride, characteristics thereof may be the same as and/or similar to those when the inorganic layer 4 contacts the substrate 1.

The organic layer 3 and inorganic layer 4 may be manufactured according to the following method.

Figure 4:
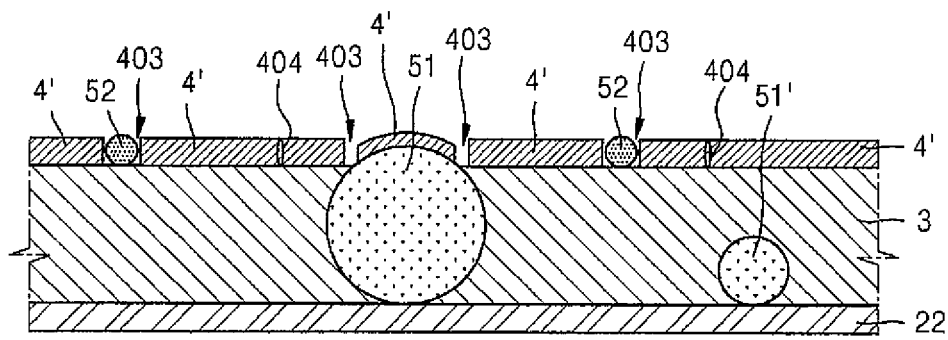
FIG. 4 is a cross-sectional view for describing a process of preparing the portion III of FIG. 1.

First, as shown in FIG. 4, the organic layer 3 is formed on the second electrode 22. In this regard, the environmental elements 51 and 51' are disposed on the second electrode 22.

The forming of the organic layer 3 may include providing a curable precursor contained in the organic layer 3 and curing the curable precursor.

The precursor may be a thermosetting or photocurable precursor having a viscosity ranging from 5 to 15 cp at room temperature and a boiling point ranging from 300° C. to 500° C. For example, the precursor may be an acrylate precursor such as mono-acrylate, dimethacrylate, and triacrylate, but is not limited thereto. The curable precursor may be a single compound or a mixture of at least two different compounds.

The providing of the curable precursor onto the organic emission unit 2 may be performed by using a flash evaporating method, but is not limited thereto.

Then, the curable precursor provided onto the organic emission unit 2 is cured by using a known method. For example, the precursor may be cured by UV rays, infrared rays, and laser beams to form the organic layer 3, but is not limited thereto.

The thickness of the organic layer 3 may be in the range of 1 μm to 5 μm. In one embodiment, if the thickness of the organic layer 3 is within the range described above, at least one portion of the environmental element 51 or 51' is covered with the organic layer 3 to improve bending characteristics of the inorganic layer 4.

According to an embodiment of the present invention, a curable precursor mixture including mono-acrylate, dimethacrylate, and triacryrate at a weight ratio of about 2:7:1, which has a viscosity ranging from 5 to 15 cp at room temperature, and a boiling point ranging from 300 to 500° C. may be formed on the organic emission unit 2, as a curable precursor, by using a flash evaporating method (film-forming rate: about 200 Å/s and film-forming time: 3 to 4 min). In this regard, the curable precursor mixture is condensed to a liquid phase as soon as the curable precursor mixture is provided onto the organic emission unit 2, and thus at least one portion of the surface of the environmental element 51 or 51' is surrounded by the curable precursor, without an empty space between the environmental elements 51 and 51'. Then, the curable precursor mixture provided onto the organic emission unit 2 is cured to form the organic layer 3 by using a UV curing device (wavelength: 390 nm and light quantity: 500 mJ).

Since the thicknesses of the environmental elements 51 and 51' are in the range of 1 to 5 μm as described above, the curable precursor layer having a thickness of about 4 μm is formed. The film-forming rate of the curable precursor is very fast at a rate of 200 Å/s, and thus the formation of the curable precursor having a thickness of 4 μm may take 3 to 4 minutes.

Then, a pre-inorganic layer 4' is formed on the organic layer 3. The pre-inorganic layer 4' includes the LVT inorganic material.

The pre-inorganic layer 4' may be formed on the organic layer 3 by using the LVT inorganic material via vacuum deposition, low temperature deposition, plasma chemical vapor deposition (PCVD), plasma-ion assisted deposition (PIAD), slit coating, flash evaporation, e-beam coating, or ion plating. Particularly, a layer of an inorganic material including $SnO—SnF_2—P_2O_5—WO_3$ may be formed by sputtering. In more detail, the sputtering may be performed by using a dual rotary target while a substrate moves. Argon plasma (12 kw and 0.4 Pa) may be used, and a desired thickness may be obtained by repeating scanning a plurality of times. Accordingly, the pre-inorganic layer 4' having a thickness of about 1 μm is formed.

If the pre-inorganic layer 4' is formed on a bent portion of the environmental element 51, the layer may not be consecutively formed, and a gap 403 is formed, as shown in FIG. 4. In addition, the pre-inorganic layer 4' is not uniformly formed and a film-forming element 52 may be formed when the layer is formed. The film-forming element 52 may include an inorganic material having a composition that is the same as and/or similar to that of the pre-inorganic layer 4'. The gap 403 is also formed at the film-forming element 52 portion.

In addition, the pre-inorganic layer 4' may have a plurality of pin holes 404.

The gaps 403 and pin holes 404 provide a pathway through which moisture and/or air may infiltrate. Thus, the gaps 403 and pin holes 404 are removed by the healing (annealing) process.

If fluidity is provided to the formed pre-inorganic layer 4' by the healing process, and then the pre-inorganic layer 4' is solidified as shown in FIG. 4, the upper surface 401 of the inorganic layer 4 becomes flat as shown in FIG. 3.

The healing process is a process of providing fluidity by heating the pre-inorganic layer 4' to a temperature higher than the viscosity transition temperature thereof. The healing process is performed at a temperature greater than the viscosity transition temperature of the LVT inorganic material. For example, the healing process may be performed by heat-treating the pre-inorganic layer 4' from a temperature in the range of the viscosity transition temperature of the LVT inorganic material to the denaturation temperature of a material contained in the organic emission layer. Alternatively, the healing process may be performed by heat-treating the pre-inorganic layer 4' from a temperature in the range of the viscosity transition temperature of the LVT inorganic material to a minimum value of the denaturation temperature of the material contained in the organic emission layer. Alternatively, the healing process may be performed at the viscosity transition temperature of the LVT inorganic material.

The "viscosity transition temperature of the LVT inorganic material" may vary according to the composition of the LVT inorganic material, and the "denaturation of the material contained in the organic emission layer" may vary according to the material used in the organic emission layer 23. However, they will be easily understood by those of ordinary skill in the art according to the composition of the LVT inorganic material and the material used in the organic emission layer 23, for example, by using an evaluation of Tg temperature obtained from TGA analysis results of the material contained in the organic emission layer 23.

For example, the healing process may be performed by heat-treating the pre-inorganic layer 4' at a temperature in the range of 80° C. to 132° C., for example, in the range of 80° C. to 120° C. or 100° C. to 120° C., for 1 to 3 hours, for example, at 110° C. for 2 hours, but is not limited thereto. In one embodiment, if the healing process is within the range described above, the LVT inorganic material of the pre-inorganic layer 4' is fluidized, and the denaturation of the organic emission layer 23 is prevented.

The healing process may be performed in a vacuum or in a nitrogen or argon atmosphere using an IR oven. The healing process may be performed for 1 to 3 hours.

However, the healing process is not limited thereto, and laser scanning may be used to perform the healing process.

By cooling the heat-treated pre-inorganic layer 4', the pre-inorganic layer 4' shown in FIG. 4 is transformed to the inorganic layer 4 shown in FIG. 3. The fluidized LVT inorganic material is filled in the gaps 403 and pin holes 404 of the pre-inorganic layer 4' shown in FIG. 4, so that the gaps 403 and pin holes 404 are removed. In addition, the film-forming element 52 that existed in the pre-inorganic layer 4' is absorbed by the inorganic layer 4 while the pre-inorganic layer 4' is transformed to the inorganic layer 4 due to fluidity.

The healing process described above is not limited to a single process, but a plurality of sub-processes may be performed. In addition, post-processing may be performed after the healing process, by using chemical treatment, plasma treatment, hot chamber treatment including oxygen, hot chamber treatment including oxygen and moisture, or surface doping. Due to the post-processing, a binding force between the environmental element 51 and the inorganic layer 4 treated with the healing process, and a binding force between the LVT inorganic materials of the inorganic layer 4 treated with the healing process may be improved.

As such, according to an embodiment of the present invention described with reference to FIG. 3, even if the environmental element 51 that is thicker than the organic layer 3 is contained in the organic layer 3, a firm inorganic layer 4 may be formed on the organic layer 3, and the inorganic layer 4 may be densely bound to the environmental element 51, so that breakage of a sealing structure due to the environmental element 51 may be prevented. In addition, since the organic layer 3 having a set or predetermined thickness is formed, and then the inorganic layer 4 is formed, a process taking time may be considerably reduced and thus mass-production possibility may be improved, compared with a method of forming a sealing structure using a single layer of the inorganic layer 4. If the inorganic layer 4 contacts the organic layer 3 as shown herein, relatively undesirable bending characteristics of the inorganic layer 4 may be compensated for by the organic layer 3. Thus, bending characteristics of the laminate of the organic layer 3 and the inorganic layer 4 may be improved.

Figure 5:
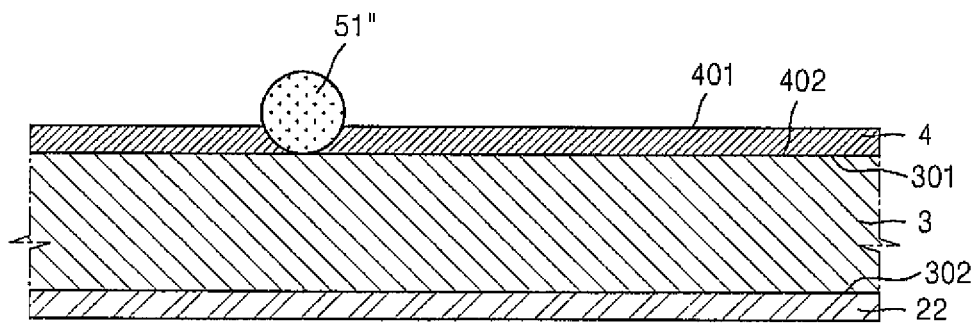
FIG. 5 is another example of the cross-sectional view of the portion III of FIG. 1.

FIG. 5 is another example of the cross-sectional view of portion III of FIG. 1. In FIG. 5, an environmental element 51" is disposed on the organic layer 3. In this regard, the upper surface 401 of the inorganic layer 4 is planarized, and accordingly, the inorganic layer 4 may contact the environmental element 51" to surround the borders of the environmental element 51". Thus, damage due to the environmental element 51" disposed on the organic layer 3 may be prevented.

Figure 6:
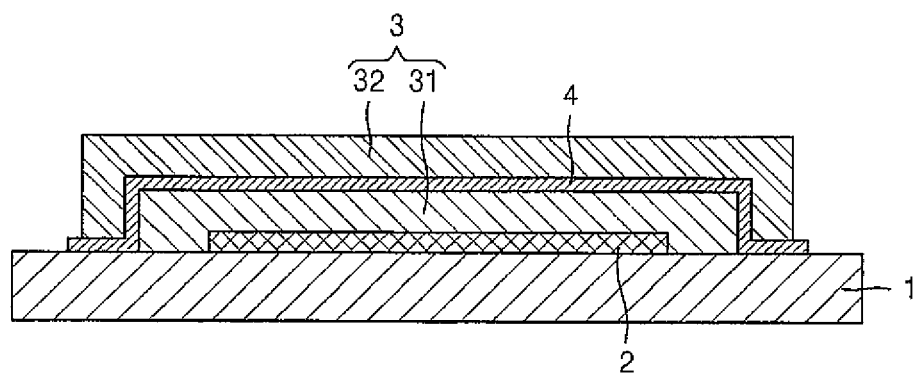
FIG. 6 is a schematic cross-sectional view of an organic light-emitting display device according to another embodiment of the present invention.

FIG. 6 is a schematic cross-sectional view of an organic light-emitting display device according to another embodiment of the present invention. The organic layer 3 includes a first organic layer 31 that covers the organic emission unit 2 and a second organic layer 32 that covers the inorganic layer 4. The first organic layer 31 and the second organic layer 32 may be formed of the same organic material. However, the organic layer 3 is not limited thereto, and the second organic layer 32 may include a heat-resistant organic material. In this regard, the heat-resistant organic material may have a composition that is the same as and/or similar to that of the first organic layer 31.

Figure 7:
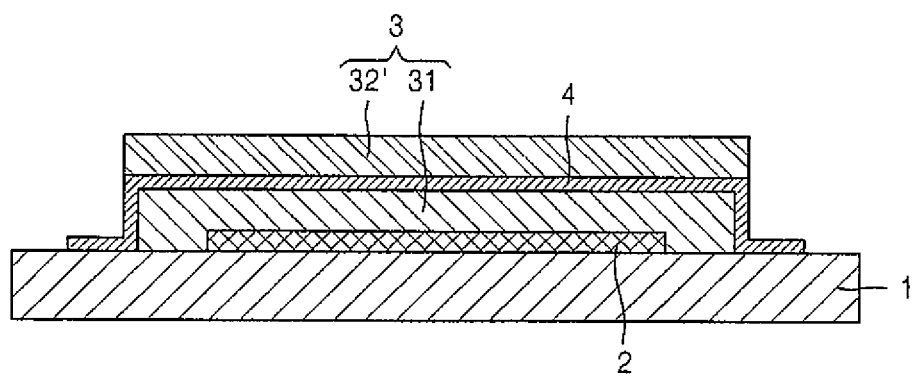
FIG. 7 is a schematic cross-sectional view of an organic light-emitting display device according to another embodiment of the present invention.

The structure of the second organic layer 32 may be formed to cover the entire surface of the inorganic layer 4 as shown in FIG. 6, but is not limited thereto. For example, as shown in FIG. 7, the second organic layer 32' may be formed only on the upper surface of the inorganic layer 4. In addition, as shown in FIG. 8, the second organic layer 32" may be formed to cover the upper surface and a portion of the side of the inorganic layer 4.

The second organic layers 32, 32', and 32" may not be formed in the same manner as the first organic layer 31, and may be formed by a coating method such as screen printing.

Figure 8:
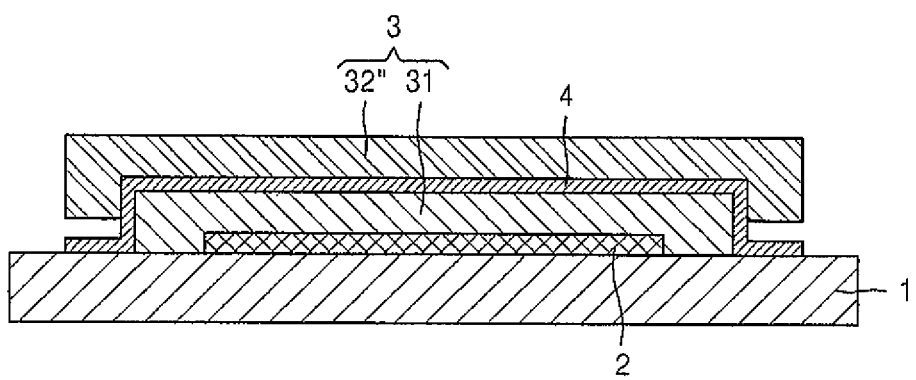
FIG. 8 is a schematic cross-sectional view of an organic light-emitting display device according to another embodiment of the present invention.

The second organic layers 32, 32', and 32" shown in FIGS. 6 to 8 protect the inorganic layer 4 from external impact, or the like, and compensate for bending characteristics of the inorganic layer 4.

Although not shown herein, at least one inorganic layer and/or a laminate of the inorganic layer/organic layer may be further formed to cover the second organic layers 32, 32', and 32". The inorganic layer may be formed by using the LVT inorganic material via the healing (annealing) process, but is not limited thereto. A different inorganic material from the inorganic layer 4, such as silicon-based oxide and/or silicon-based nitride, and/or aluminum-based oxide and/or aluminum-based nitride, may also be applied.

Figure 9:
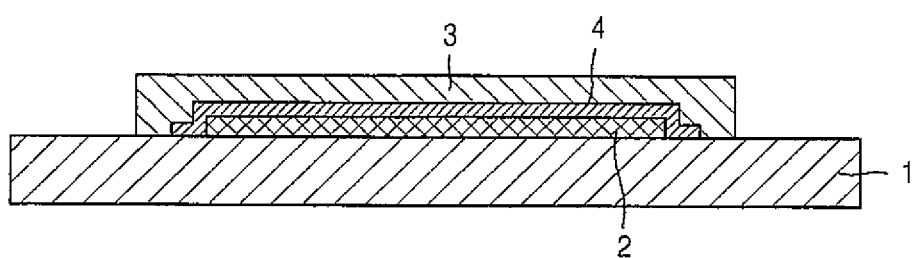
FIG. 9 is a schematic cross-sectional view of an organic light-emitting display device according to another embodiment of the present invention.
Figure 10:
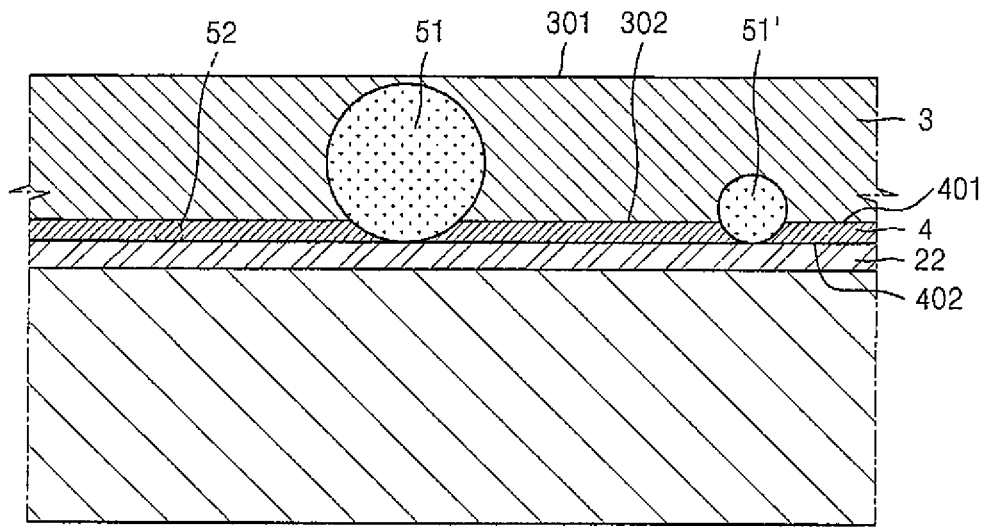
FIG. 10 is a cross-sectional view of a portion of FIG. 9.

FIG. 9 is a schematic cross-sectional view of an organic light-emitting display device according to another embodiment of the present invention, and FIG. 10 is a cross-sectional view of a portion X of FIG. 9. The inorganic layer 4 is formed to cover the organic emission unit 2, and then the organic layer 3 is formed to cover the inorganic layer 4. In this regard, as described above, the inorganic layer 4 has a flat upper surface 401, and thus the inorganic layer may densely contact the environmental elements 51 and 51' to surround the environmental elements 51 and 51'. Accordingly, the inorganic layer 4 having dense barrier characteristics in which defects with respect to the environmental elements 51 and 51' are rectified may be formed. Since the inorganic layer 4 is covered with the organic layer 3, and the upper surface 301 of the organic layer 3 is flat, barrier characteristics of the laminate of the inorganic layer 4 and the organic layer 3 may be further improved. As described above, since a thick inorganic layer 4 cannot be formed due to limitation of the process, the environmental elements 51 and 51' are exposed at an external surface of the inorganic layer 4. The upper surface 301 of the organic layer 3 is planarized by covering the inorganic layer 4 with the organic layer 3, and thus deterioration of barrier characteristics due to the environmental elements 51 and 51' may be completely blocked. The organic layer 3 may further improve bending characteristics of the inorganic layer 4.

Figure 11:
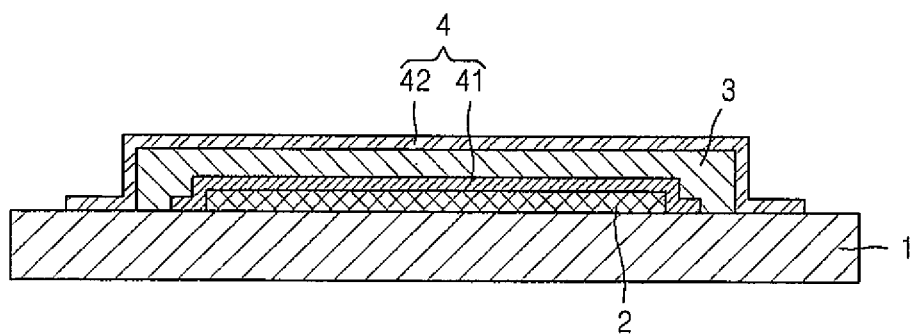
FIG. 11 is a schematic cross-sectional view of an organic light-emitting display device according to another embodiment of the present invention.

FIG. 11 is a schematic cross-sectional view of an organic light-emitting display device according to another embodiment of the present invention. The inorganic layer 4 includes a first inorganic layer 41 that covers the organic emission unit 2 and a second inorganic layer 42 that covers the organic layer 3. The organic layer 3 is interposed between the first inorganic layer 41 and the second inorganic layer 42. The second organic layer 42 may be the same as the first inorganic layer 41. That is, the first inorganic layer 41 and the second inorganic layer 42 may be formed of the LVT inorganic material, and the upper surface thereof may be planarized by the healing process. However, the present invention is not limited thereto. The first inorganic layer 41 may be formed of the LVT inorganic material by the healing process, and the second inorganic layer 42 may be formed of a different inorganic material from the first inorganic layer 41, such as silicon-based oxide and/or silicon-based nitride and/or aluminum-based oxide and/or aluminum-based nitride. In this regard, since barrier characteristics of the first inorganic layer 41 and the second inorganic layer 42 are different from each other, advantages and disadvantages of the first inorganic layer 41 and the second inorganic layer 42 may be compensated for.

Although not shown herein, an organic layer may further be formed to cover the second inorganic layer 42, and a plurality of laminates of the organic layer/inorganic layer may further be formed thereon.

Figure 12:
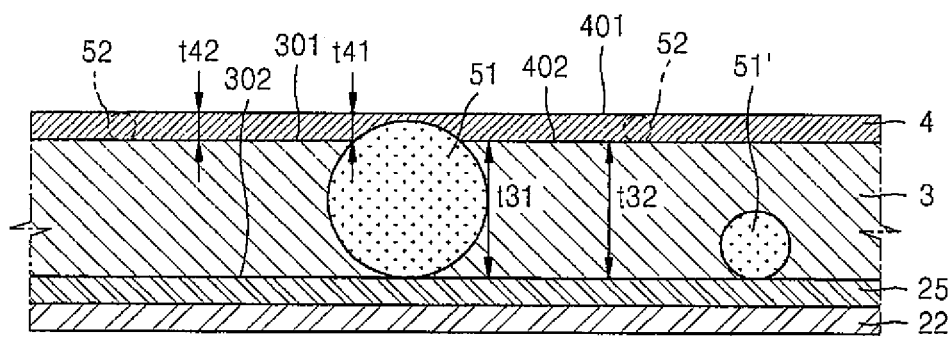
FIG. 12 is a schematic cross-sectional view of a portion of an organic light-emitting display device according to another embodiment of the present invention.

FIG. 12 is a schematic cross-sectional view of a portion of an organic light-emitting display device according to another embodiment of the present invention, in which a protective layer 25 is further interposed between the organic layer 3 and the second electrode 22 of FIG. 3.

The protective layer 25 may be formed of LiF, lithium quinolate, Alq3, or the like.

The protective layer 25 may be formed on the second electrode 22 of all structures shown in FIGS. 4 to 11.

Figure 13:
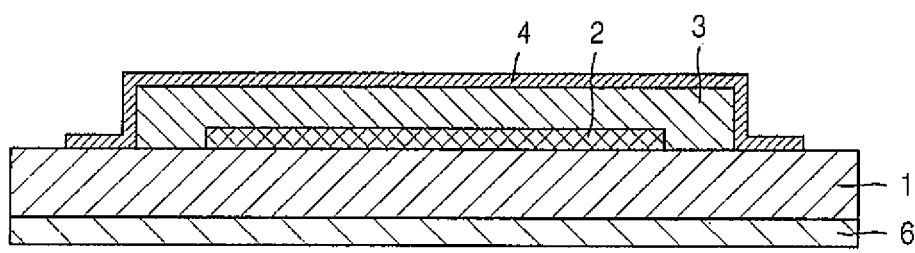
FIG. 13 is a schematic cross-sectional view of an organic light-emitting display device according to another embodiment of the present invention.

FIG. 13 is a schematic cross-sectional view of an organic light-emitting display device according to another embodiment of the present invention, in which a third organic layer 6 is formed under the substrate 1 of FIG. 1. The structure of FIG. 13 is efficient when the substrate 1 is formed of a glass material. In other words, the substrate 1 formed of a glass material has poor bending characteristics, even though a thin substrate 1 is used. In this regard, if the third organic layer 6 is formed under the substrate 1, bending characteristics of the third organic layer 6 may be improved. For example, a bending radius of a 0.1 mm-thick glass substrate is about 10 cm. If an acrylic organic layer having a thickness of about 5 μm is formed under the substrate, the substrate does not break after being bent 10,000 times and has a bending radius of about 2 cm. In addition, the third organic layer 6 compensates for the structural strength of the substrate 1 in a direction from the lower surface of the substrate 1. The material for forming the third organic layer 6 may not be the same as that for the first organic layer and/or second organic layer.

The third organic layer 6 formed under the substrate 1 may also be applied to all structures of FIGS. 4 to 12.

Figure 14:
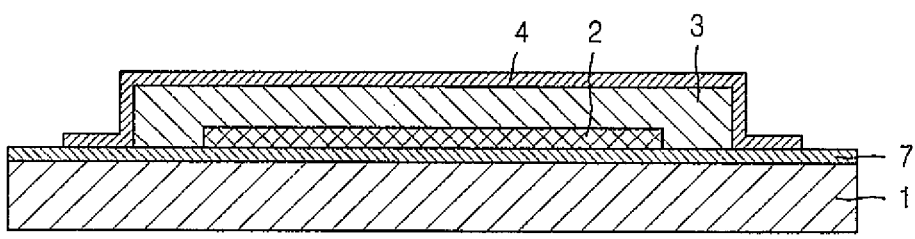
FIG. 14 is a schematic cross-sectional view of an organic light-emitting display device according to another embodiment of the present invention.

FIG. 14 is a schematic cross-sectional view of an organic light-emitting display device according to another embodiment of the present invention, in which a third inorganic layer 7 is interposed between the substrate 1 and the organic emission unit 2 of FIG. 1. The third inorganic layer 7 may be formed by using the LVT inorganic material via the healing process. Although not shown herein, a pixel circuit unit including a TFT and/or a capacitor may be formed on the third inorganic layer 7. In this regard, due to dense barrier characteristics of the third inorganic layer 7, the sealing characteristics of the organic emission unit 2 may further be improved. The third inorganic layer 7 is utilized for the substrate 1 having poor barrier characteristics, for example, the substrate 1 formed of plastic.

Although FIG. 14 shows a structure in which the third inorganic layer 7 is formed on the upper surface of the substrate 1, the present invention is not limited thereto. The third inorganic layer 7 may also be formed under the substrate 1 or at the side of the substrate 1. As such, the third inorganic layer 7 is formed to contact the substrate 1 to improve barrier characteristics of the substrate 1.

The third inorganic layer 7 may be applied to all structures of FIGS. 4 to 13.

While the present invention has been particularly shown and described with reference to exemplary embodiments thereof, it will be understood by those of ordinary skill in the art that various changes in form and details may be made therein without departing from the spirit and scope of the present invention as defined by the following claims, and equivalents thereof.

What is claimed is:

1. An organic light-emitting display device comprising:
a substrate;
an organic emission unit on the substrate, the organic emission unit comprising a stacked structure of a first electrode, an organic emission layer, and a second electrode;
at least one continuous organic layer on the substrate and the organic emission unit, and contacting an environmental element; and
at least one inorganic layer on the substrate and the organic emission unit, contacting and entirely covering the organic layer in a planar direction, and contacting the environmental element to surround at least a portion of a border of the environmental element.

2. The organic light-emitting display device of claim 1, wherein the organic layer contacts the environmental element so as to surround the other portion of the border of the environmental element.

3. The organic light-emitting display device of claim 1, wherein a viscosity transition temperature of an inorganic material contained in the inorganic layer is less than a minimum value of a denaturation temperature of a material contained in the organic emission layer.

4. The organic light-emitting display device of claim 1, wherein the inorganic layer contacts the environmental element so as not to form a gap between the inorganic layer and the environmental element.

5. The organic light-emitting display device of claim 1, wherein the inorganic layer has a thickness at an area which contacts the environmental element that is different than another thickness at another area of the inorganic layer which does not contact the environmental element.

6. The organic light-emitting display device of claim 1, wherein the inorganic layer has a flat upper surface.

7. The organic light-emitting display device of claim 1, wherein the inorganic layer comprises a tin oxide.

8. The organic light-emitting display device of claim 1, wherein the organic layer has a flat upper surface.

9. The organic light-emitting display device of claim 1, wherein the organic layer is directly on the organic emission unit.

10. The organic light-emitting display device of claim 1, wherein the inorganic layer is directly on the organic emission unit.

11. The organic light-emitting display device of claim 1, further comprising a protective layer interposed between the organic layer or inorganic layer and the organic emission unit.

12. An organic light-emitting display device comprising:
a substrate;
an organic emission unit on the substrate, the organic emission unit comprising a stacked structure of a first electrode, an organic emission layer, and a second electrode;
a continuous first organic layer on the substrate and the organic emission unit, and contacting an environmental element; and
a first inorganic layer on the substrate and the organic emission unit, sealing and entirely covering the organic emission unit from external air, and having a thickness at an area which contacts the environmental element that is different than another thickness at another area of the first inorganic layer which does not contact the environmental element.

13. The organic light-emitting display device of claim 12, wherein the first inorganic layer has a flat surface and a non-flat surface which are disposed opposite to each other, and
wherein the flat surface faces away from the substrate.

14. The organic light-emitting display device of claim 12, wherein the first organic layer has a flat surface and a non-flat surface which are disposed opposite to each other.

15. The organic light-emitting display device of claim 12, wherein the first inorganic layer comprises an inorganic material, and
wherein a temperature at which fluidity is provided to the inorganic material of the first inorganic layer is in a range from a viscosity transition temperature of the inorganic material of the first inorganic layer to a minimum value of a denaturation temperature of a material contained in the organic emission layer.

16. The organic light-emitting display device of claim 12, wherein the first inorganic layer comprises a tin oxide.

17. The organic light-emitting display device of claim 12, further comprising a second inorganic layer on one surface of the substrate to contact the substrate and has a thickness at an area which contacts an environmental element that is different than another thickness at another area of the first inorganic layer which does not contact the environmental element.

18. The organic light-emitting display device of claim 17, wherein the second inorganic layer comprises an inorganic material, and
wherein a temperature at which fluidity is provided to the inorganic material of the second inorganic layer is less than a denaturation temperature of a material contained in the organic emission layer.

19. The organic light-emitting display device of claim 17, wherein the second inorganic layer comprises a tin oxide.

20. The organic light-emitting display device of claim 12, further comprising a protective layer between the first organic layer or first inorganic layer and the organic emission unit.

21. A method of forming an organic light-emitting display device, the method comprising:
forming an organic emission unit on a substrate to comprise a stacked structure of a first electrode, an organic emission layer, and a second electrode;
forming an organic layer on the substrate and the organic emission unit; and
forming an inorganic layer on the substrate and the organic emission unit to seal and entirely cover the organic emission unit from external air with the inorganic layer,
wherein the forming of the inorganic layer comprises depositing a pre-inorganic material on the organic layer, providing fluidity to the deposited pre-inorganic material to form a flat upper surface, and solidifying the pre-inorganic material to form the inorganic material, and wherein a temperature at which fluidity is provided to the inorganic material of the inorganic layer is in a range from a viscosity transition temperature of the inorganic material of the inorganic layer to a minimum value of a denaturation temperature of a material contained in the organic emission layer.

22. A method of forming an organic light-emitting display device, the method comprising:

forming an organic emission unit on a substrate to comprise a stacked structure of a first electrode, an organic emission layer, and a second electrode;

forming an organic layer on the substrate and the organic emission unit; and forming an inorganic layer on the substrate and the organic emission unit wherein a viscosity transition temperature of an inorganic material contained in the inorganic layer is less than a minimum value of a denaturation temperature of a material contained in the organic emission layer, wherein the forming of the inorganic layer comprises depositing a pre-inorganic material on the organic layer in a planar direction, providing fluidity to the deposited pre-inorganic material to from a flat upper surface, and solidifying the pre-inorganic material, and wherein the inorganic layer entirely covers the organic layer.

23. The method of claim 22, wherein the forming of the inorganic layer further comprises contacting the inorganic layer to an environmental element to surround at least a portion of a border of the environmental element.

* * * * *